United States Patent
Saito et al.

(10) Patent No.: US 10,910,851 B2
(45) Date of Patent: Feb. 2, 2021

(54) OVERCURRENT, OVERCHARGE, AND OVERDISCHARGE DETECTION AND RESPONSIVE SWITCH CONTROL

(71) Applicant: ABLIC Inc., Chiba (JP)

(72) Inventors: Hiroshi Saito, Chiba (JP); Akihiko Suzuki, Hamamatsu (JP); Takahiro Kuratomi, Hamamatsu (JP)

(73) Assignee: ABLIC INC., Chiba (JP)

( * ) Notice: Subject to any disclaimer, the term of this patent is extended or adjusted under 35 U.S.C. 154(b) by 300 days.

(21) Appl. No.: 15/956,290

(22) Filed: Apr. 18, 2018

(65) Prior Publication Data
US 2018/0309308 A1    Oct. 25, 2018

(30) Foreign Application Priority Data

Apr. 20, 2017   (JP) ................................. 2017-083839

(51) Int. Cl.
*H02J 7/00*   (2006.01)
*G01R 31/3835*   (2019.01)

(52) U.S. Cl.
CPC .............. *H02J 7/0031* (2013.01); *H02J 7/00* (2013.01); *H02J 7/0036* (2013.01); *H02J 7/0086* (2013.01); *H02J 7/007182* (2020.01); *G01R 31/3835* (2019.01); *H02J 7/00302* (2020.01); *H02J 7/00304* (2020.01); *H02J 7/00306* (2020.01)

(58) Field of Classification Search
CPC .. H02J 7/0031; H02J 7/007182; H02J 7/0036; H02J 7/0086; H02J 7/0068; H02J 7/0029; H01M 10/4257; H01M 10/4285

USPC ......................................................... 320/107
See application file for complete search history.

(56) References Cited

U.S. PATENT DOCUMENTS

| | | | | |
|---|---|---|---|---|
| 5,493,197 A | * | 2/1996 | Eguchi | H02J 7/0031 320/116 |
| 5,547,775 A | * | 8/1996 | Eguchi | G01R 19/16542 320/116 |
| 5,583,384 A | * | 12/1996 | Henry | H01M 10/48 257/213 |

(Continued)

FOREIGN PATENT DOCUMENTS

| | | | | |
|---|---|---|---|---|
| JP | 11234911 A | * | 8/1999 | |
| JP | 2005073497 A | * | 3/2005 | |

(Continued)

*Primary Examiner* — John T Trischler
(74) *Attorney, Agent, or Firm* — Brinks Gilson & Lione

(57) ABSTRACT

A charge/discharge control circuit includes a control circuit which outputs a control signal to a charge control terminal and a discharge control terminal respectively, a charge/discharge monitoring circuit which monitors charge/discharge of a secondary battery, a charger detection circuit connected to a charger detection terminal and configured to detect a charger connection, and a load open detection circuit connected to the charger detection terminal and configured to detect a state of a load. In response to reception of a signal to instruct turning on of a charge control FET from the charger detection circuit, the control circuit turns on the charge control FET even when the control circuit turned off the charge control FET in response to the signal to instruct turning off of the charge control FET from the charge/discharge monitoring circuit.

2 Claims, 3 Drawing Sheets

(56) References Cited

U.S. PATENT DOCUMENTS

| | | | | |
|---|---|---|---|---|
| 5,635,821 A * | 6/1997 | Smith | H02J 7/0031 | 320/103 |
| 5,689,209 A * | 11/1997 | Williams | H02J 7/0031 | 327/425 |
| 5,703,463 A * | 12/1997 | Smith | H01M 10/46 | 320/134 |
| 5,808,446 A * | 9/1998 | Eguchi | H02J 7/00711 | 320/134 |
| 5,847,544 A * | 12/1998 | Eguchi | H02J 7/00711 | 320/136 |
| 5,898,234 A * | 4/1999 | Kitagawa | H02J 9/06 | 307/48 |
| 5,929,593 A * | 7/1999 | Eguchi | H02J 7/00711 | 320/139 |
| 6,150,797 A * | 11/2000 | Mukainakano | H02J 7/0086 | 320/134 |
| 6,160,381 A * | 12/2000 | Peterzell | H02H 3/12 | 320/134 |
| 6,172,482 B1 * | 1/2001 | Eguchi | H02H 7/18 | 320/134 |
| 6,194,871 B1 * | 2/2001 | Haraguchi | H02J 7/0031 | 320/134 |
| 6,297,619 B1 * | 10/2001 | Terada | H02J 7/0031 | 320/134 |
| 6,326,771 B1 * | 12/2001 | Popescu-Stanesti | H02J 7/0068 | 320/139 |
| 6,340,880 B1 * | 1/2002 | Higashijima | H02J 7/0031 | 320/162 |
| 6,504,345 B2 * | 1/2003 | Sakurai | H02J 7/0031 | 320/162 |
| 6,563,292 B2 * | 5/2003 | Fujiwara | H02J 7/0031 | 320/134 |
| 6,624,614 B2 * | 9/2003 | Mashiko | H02J 7/0031 | 320/128 |
| 6,690,559 B2 * | 2/2004 | Yoshida | H02J 7/0031 | 361/100 |
| 6,768,289 B2 * | 7/2004 | Fujiwara | H02J 7/0031 | 320/134 |
| 6,867,567 B2 * | 3/2005 | Yokota | H02J 7/0047 | 320/134 |
| 6,879,133 B1 * | 4/2005 | Geren | H02J 7/0031 | 320/134 |
| 6,992,463 B2 * | 1/2006 | Yoshio | B60L 3/0046 | 320/134 |
| 7,495,416 B2 * | 2/2009 | Sato | H02J 7/0031 | 320/134 |
| 7,592,773 B2 * | 9/2009 | Pellenc | H02J 7/0013 | 320/112 |
| 7,598,708 B2 * | 10/2009 | Kimura | H02J 7/0031 | 320/132 |
| 7,772,805 B2 * | 8/2010 | Yamamoto | H02J 7/0031 | 320/132 |
| 7,791,315 B2 * | 9/2010 | Sakurai | H02J 7/0034 | 320/134 |
| 8,049,469 B2 * | 11/2011 | Kim | H02J 7/0031 | 320/153 |
| 8,089,247 B2 * | 1/2012 | Pellenc | H02J 7/0042 | 320/112 |
| 8,193,774 B2 * | 6/2012 | Takeda | H02J 7/0031 | 320/134 |
| 8,378,635 B2 * | 2/2013 | Koike | H02J 7/0031 | 320/134 |
| 8,482,257 B2 * | 7/2013 | Sakurai | H02J 7/0036 | 320/134 |
| 8,552,878 B2 * | 10/2013 | Jordan | G06F 1/30 | 340/663 |
| 8,558,513 B2 * | 10/2013 | Kim | H02J 7/0031 | 320/153 |
| 8,648,572 B2 * | 2/2014 | Kiyohara | H01M 10/44 | 320/134 |
| 8,803,481 B2 * | 8/2014 | Tachikawa | H01M 10/4207 | 320/134 |
| 8,810,193 B2 * | 8/2014 | Maruyama | H01M 10/482 | 320/107 |
| 8,941,360 B2 * | 1/2015 | Saito | H02J 7/0016 | 320/136 |
| 9,000,726 B2 * | 4/2015 | Sakurai | H02J 7/0019 | 320/118 |
| 9,374,077 B2 * | 6/2016 | Sakurai | H03K 17/0822 | |
| 9,466,993 B2 * | 10/2016 | Saito | H02J 7/0031 | |
| 9,577,442 B2 * | 2/2017 | Sakurai | H02J 7/0016 | |
| 9,647,469 B2 * | 5/2017 | Sakurai | H02J 7/0029 | |
| 9,762,072 B2 * | 9/2017 | Kageyama | H02J 7/0029 | |
| 9,768,608 B2 * | 9/2017 | Toivola | H02H 3/243 | |
| 9,847,658 B2 * | 12/2017 | Kuhlmann | H02J 7/0026 | |
| 9,882,250 B2 * | 1/2018 | Chappelle | H01M 10/425 | |
| 9,882,469 B2 * | 1/2018 | Sakurai | H02M 3/06 | |
| 9,893,547 B2 * | 2/2018 | Wu | H02J 7/007 | |
| 9,980,358 B2 * | 5/2018 | Kim | H02J 7/025 | |
| 9,985,445 B2 * | 5/2018 | Saito | H02J 7/0026 | |
| 10,199,679 B2 * | 2/2019 | Abe | H01M 10/425 | |
| 10,205,197 B2 * | 2/2019 | Saito | H02J 7/0029 | |
| 10,205,330 B2 * | 2/2019 | Saito | H02J 7/0031 | |
| 10,251,252 B2 * | 4/2019 | Kim | H01M 10/48 | |
| 10,283,981 B2 * | 5/2019 | Abe | H03K 17/063 | |
| 10,290,907 B2 * | 5/2019 | Amemiya | H01M 2/348 | |
| 10,291,082 B2 * | 5/2019 | Onishi | H02J 7/0068 | |
| 10,355,499 B2 * | 7/2019 | Takeda | H02J 7/0031 | |
| 10,367,365 B2 * | 7/2019 | Wu | H02J 7/0031 | |
| 10,424,915 B2 * | 9/2019 | Kang | H02J 7/0031 | |
| 10,559,968 B2 * | 2/2020 | Saito | H02J 7/0047 | |
| 10,601,240 B2 * | 3/2020 | Onishi | H02J 50/80 | |
| 2002/0018329 A1 * | 2/2002 | Yoshida | H02J 7/0031 | 361/93.1 |
| 2002/0039671 A1 * | 4/2002 | Yanagisawa | H01M 2/1061 | 429/7 |
| 2002/0079869 A1 * | 6/2002 | Fujiwara | H02J 7/0031 | 320/157 |
| 2002/0109484 A1 * | 8/2002 | Yokota | H02J 7/0047 | 320/134 |
| 2002/0113574 A1 * | 8/2002 | Mashiko | H02J 7/0031 | 320/128 |
| 2003/0141848 A1 * | 7/2003 | Fujiwara | H02J 7/0031 | 320/134 |
| 2005/0127879 A1 * | 6/2005 | Sato | H02J 7/342 | 320/134 |
| 2005/0242779 A1 * | 11/2005 | Yoshio | B60L 58/14 | 320/134 |
| 2007/0096695 A1 * | 5/2007 | Kimura | H02J 7/0031 | 320/134 |
| 2007/0148539 A1 * | 6/2007 | Pellenc | H02J 7/0042 | 429/156 |
| 2008/0061743 A1 * | 3/2008 | Goto | H02J 7/0031 | 320/134 |
| 2008/0094038 A1 * | 4/2008 | Okada | H02J 7/0072 | 320/163 |
| 2008/0157719 A1 * | 7/2008 | Koike | H02J 7/0031 | 320/134 |
| 2008/0203971 A1 * | 8/2008 | Sakurai | H02J 7/0034 | 320/134 |
| 2009/0085521 A1 * | 4/2009 | Kim | H02J 7/0031 | 320/134 |
| 2009/0251104 A1 * | 10/2009 | Yamamoto | H01M 10/44 | 320/134 |
| 2009/0278505 A1 * | 11/2009 | Toya | H01M 10/052 | 320/152 |
| 2010/0176764 A1 * | 7/2010 | Tachikawa | H01M 10/4207 | 320/118 |
| 2011/0012560 A1 * | 1/2011 | Sakakibara | H01M 10/441 | 320/118 |
| 2011/0089906 A1 * | 4/2011 | Sakurai | H02J 7/0031 | 320/134 |
| 2011/0133571 A1 * | 6/2011 | Kiyohara | H01M 10/44 | 307/130 |
| 2011/0205678 A1 * | 8/2011 | Baba | G06F 1/3212 | 361/86 |

(56) References Cited

U.S. PATENT DOCUMENTS

| | | | |
|---|---|---|---|
| 2011/0227540 A1* | 9/2011 | Kanoh | B60L 53/00 320/135 |
| 2011/0241893 A1* | 10/2011 | Jordan | G06F 1/30 340/663 |
| 2011/0267726 A1* | 11/2011 | Ikeuchi | H01M 10/44 361/63 |
| 2011/0298463 A1* | 12/2011 | Saito | H02J 7/0016 324/426 |
| 2011/0299209 A1* | 12/2011 | Tajima | H02J 7/0031 361/104 |
| 2012/0008246 A1* | 1/2012 | Kim | H02J 7/0031 361/104 |
| 2012/0139493 A1* | 6/2012 | Sakurai | H02J 7/0016 320/118 |
| 2012/0313574 A1* | 12/2012 | Maetani | H02J 7/008 320/107 |
| 2013/0049691 A1* | 2/2013 | Sakurai | H02J 7/0019 320/118 |
| 2013/0095350 A1* | 4/2013 | Aradachi | H02J 7/0026 429/7 |
| 2013/0314033 A1* | 11/2013 | Maruyama | H01M 10/52 320/107 |
| 2014/0232345 A1* | 8/2014 | Sakurai | H03K 17/0822 320/118 |
| 2014/0239909 A1 | 8/2014 | Watanabe et al. | |
| 2014/0361746 A1* | 12/2014 | Saito | H02J 7/0031 320/118 |
| 2015/0022926 A1* | 1/2015 | Toivola | G06F 1/26 361/92 |
| 2015/0028878 A1* | 1/2015 | Tsujimoto | G01R 33/096 324/426 |
| 2015/0200537 A1* | 7/2015 | Kang | H02J 7/0031 320/134 |
| 2015/0280551 A1* | 10/2015 | Sakurai | H02M 3/06 323/304 |
| 2015/0349391 A1* | 12/2015 | Chappelle | H02J 7/0029 429/7 |
| 2016/0118821 A1* | 4/2016 | Takeda | H02J 7/0031 320/134 |
| 2016/0126758 A1* | 5/2016 | Wu | H02J 7/007 320/162 |
| 2016/0190830 A1* | 6/2016 | Kuhlmann | H02J 7/0026 320/116 |
| 2016/0190835 A1* | 6/2016 | Kageyama | H02J 7/0029 320/136 |
| 2016/0315486 A1* | 10/2016 | Shibata | H02J 7/0029 |
| 2016/0336976 A1* | 11/2016 | Onishi | H02J 50/10 |
| 2016/0344205 A1* | 11/2016 | Abe | H02J 7/0031 |
| 2016/0372945 A1* | 12/2016 | Kageyama | H02J 7/0071 |
| 2017/0005490 A1* | 1/2017 | Saito | H02J 7/0031 |
| 2017/0033412 A1* | 2/2017 | Saito | H01M 10/4257 |
| 2017/0033413 A1* | 2/2017 | Amemiya | H02J 7/0031 |
| 2017/0033578 A1* | 2/2017 | Saito | H02J 7/0031 |
| 2017/0170653 A1* | 6/2017 | Song | H02J 7/0031 |
| 2018/0013298 A1* | 1/2018 | Abe | H01L 27/0266 |
| 2018/0040929 A1* | 2/2018 | Chappelle | H02J 7/0029 |
| 2018/0042096 A1* | 2/2018 | Kim | H02J 7/0029 |
| 2018/0102706 A1* | 4/2018 | Gao | H02M 7/42 |
| 2018/0109120 A1* | 4/2018 | Nakao | H02J 7/008 |
| 2018/0131195 A1* | 5/2018 | Wu | H02J 7/007 |
| 2018/0138759 A1* | 5/2018 | Onishi | H02J 7/00 |
| 2018/0152041 A1* | 5/2018 | Onishi | H02J 7/025 |
| 2018/0217208 A1* | 8/2018 | Park | H02J 7/0047 |
| 2018/0226816 A1* | 8/2018 | Na | H02J 7/0029 |
| 2018/0233785 A1* | 8/2018 | Na | H01M 10/425 |
| 2018/0249567 A1* | 8/2018 | Kim | H02J 7/008 |
| 2018/0262035 A1* | 9/2018 | Saito | H02J 7/0031 |
| 2018/0269705 A1* | 9/2018 | Saito | H02J 7/0072 |
| 2018/0301921 A1* | 10/2018 | Saito | H02J 7/0068 |
| 2019/0081490 A1* | 3/2019 | Saito | H02J 7/0031 |
| 2019/0081491 A1* | 3/2019 | Saito | H02J 7/0031 |
| 2019/0123398 A1* | 4/2019 | Saito | H01M 2/348 |
| 2019/0123399 A1* | 4/2019 | Saito | H01M 2/348 |
| 2019/0148963 A1* | 5/2019 | Nakao | H02J 7/0031 320/134 |
| 2019/0181665 A1* | 6/2019 | Shibata | H02J 7/0026 |
| 2019/0215939 A1* | 7/2019 | Kim | H01M 10/425 |
| 2019/0237820 A1* | 8/2019 | Amemiya | H02J 7/0031 |
| 2020/0076209 A1* | 3/2020 | Takeda | H02J 7/0026 |

FOREIGN PATENT DOCUMENTS

| | | | |
|---|---|---|---|
| JP | 2008104351 A | * 5/2008 | |
| JP | 2009005559 A | * 1/2009 | H01M 2/34 |
| JP | 5437770 B2 | 3/2014 | |
| JP | 2014-166071 A | 9/2014 | |

* cited by examiner

OVERCURRENT, OVERCHARGE, AND OVERDISCHARGE DETECTION AND RESPONSIVE SWITCH CONTROL

RELATED APPLICATIONS

This application claims priority under 35 U.S.C. § 119 to Japanese Patent Application No. 2017-083839 filed on Apr. 20, 2017, the entire content of which is hereby incorporated by reference.

BACKGROUND OF THE INVENTION

Field of the Invention

The present invention relates to a charge/discharge control circuit and a battery apparatus.

Background Art

There has heretofore been known a battery apparatus having a charge/discharge control circuit equipped with a first power supply terminal connected to a first electrode of a secondary battery, a second power supply terminal connected to a second electrode of the secondary battery, a charge control terminal connected to a gate terminal of a charge control FET which controls charging to the secondary battery, a discharge control terminal connected to a gate terminal of a discharge control FET which controls discharging from the secondary battery, an overcharge detection circuit which detects overcharge of the secondary battery, an overdischarge detection circuit which detects overdischarge of the secondary battery, and a charger detection terminal for detecting whether a charger is connected (refer to, for example, FIGS. 1 and 5 in Japanese Patent No. 5437770). In such a battery apparatus, although not specified in Japanese Patent No. 5437770, the charger detection terminal has also generally been used as a terminal for monitoring the state of a load connected to the battery apparatus.

Further, there has also been known a battery apparatus which is equipped with a charge/discharge control circuit having an overcurrent detection terminal and an overcurrent detection circuit to improve the detection accuracy of a discharge overcurrent and a charge overcurrent by providing a resistor having one end connected to a second electrode of a secondary battery and the other end connected to a source terminal of a discharge control FET and an overcurrent detection terminal, and detecting a potential difference generated across the resistor by a current flowing through the resistor (refer to, for example, Japanese Patent Application Laid-Open No. 2014-166071).

On the other hand, comparing a charge overcurrent generated by the connection of an abnormal charger and a discharge overcurrent generated due to the abnormality of a connected load, the latter generally becomes often large. Accordingly, the discharge control FET is required to have a high current capability, whereas the charge control FET can have a lower current capability. Consequently, there has been a growing demand for a charge/discharge control circuit with which a battery apparatus can be configured in such a manner that a charging path and a discharging path are separated (refer to, for example, FIG. 4 in Japanese Patent No. 5437770), and a low cost FET having low current capability can be used for a charge control FET.

SUMMARY OF THE INVENTION

Configuring the battery apparatus in which the charging path and the discharging path are separated from each other in such a manner that the detection of a connection state of a charger and the detection of the overcurrent with high accuracy, both illustrated in Japanese Patent No. 5437770, are both possible, the following phenomena, however, occur.

That is, in an overcharge detection state, in which the charge/discharge control circuit turns off the charge control FET after the secondary battery is charged by the charger and the voltage of the secondary battery becomes a voltage more than or equal to an overcharge voltage, once the load connected to the battery apparatus takes an abnormal state and a large current flows, the charge/discharge control circuit is brought into a discharge overcurrent detection state in which the discharge control FET is turned off by detection of a discharge overcurrent. At this time it is not possible to monitor the state of the load because the terminal (charger detection terminal) for monitoring the state of the load is separated from the load. Thus, even if an abnormal state of the connected load is released, the battery apparatus cannot recover from the discharge overcurrent state until the disconnection of the charger is detected, and the voltage of the secondary battery falls below the overcharge voltage to turn on the charge control FET.

The present invention aims to provide a charge/discharge control circuit and a battery apparatus in which a charging path and a discharging path are separated, and which is capable of monitoring the state of the load at a release from an abnormal state of the connected load which caused a discharge overcurrent detection in a discharge overcurrent detection state after being in an overcharge detection state.

In one aspect of the present invention, there is provided a charge/discharge control circuit equipped with a first power supply terminal connected to a first electrode of a secondary battery, a second power supply terminal connected to a second electrode of the secondary battery, a charge control terminal connected to a gate terminal of a charge control FET which controls charging to the secondary battery, a discharge control terminal connected to a gate terminal of a discharge control FET which controls discharging from the secondary battery, an overcurrent detection terminal connected to a source terminal of the discharge control FET, a charger detection terminal connected to a charger, a control circuit configure to output a control signal to the charge control terminal and the discharge control terminal respectively, a charge/discharge monitoring circuit connected to the first power supply terminal and the second power supply terminal, configured to monitor charge/discharge of the secondary battery, and configured to output a signal to instruct turning off of the charge control FET or the discharge control FET to the control circuit in response to detection of overcharge or overdischarge of the secondary battery, an overcurrent detection circuit connected to the overcurrent detection terminal and configured to output a signal to instruct turning off of the discharge control FET to the control circuit according to detection of a discharge overcurrent, based on a voltage of the overcurrent detection terminal, a charger detection circuit connected to the charger detection terminal and configured to output a signal to instruct turning on of the charge control FET to the control circuit according to detection of disconnection of the charger based on a voltage of the charger detection terminal, and a load open detection circuit connected to the charger detection terminal and configured to output a signal to instruct turning on of the discharge control FET to the control circuit according to detection based on the voltage of the charger detection terminal that a load connected to the charger detection terminal is in a normal state, and in which the control circuit turns on the charge control FET in response to the signal to instruct turning on of the charge control FET from the charger detection circuit, even when the control circuit turns off the charge control FET in response to the signal to instruct turning off of the charge control FET from the charge/discharge monitoring circuit.

Further, in another aspect of the present invention, there is provided a battery apparatus equipped with a secondary battery, a charge/discharge terminal connected to a first electrode of the secondary battery, a resistor having one end connected to a second electrode of the secondary battery, a discharge control FET having a source terminal connected to the other end of the resistor, a charge control FET having a drain terminal connected to a drain terminal of the discharge control FET, a charge terminal connected to a source terminal of the charge control FET, and a discharge terminal connected to a connecting point of the charge control FET and the discharge control FET, and in which a charger is connected between the charge/discharge terminal and the charge terminal, and a load is connected between the charge/discharge terminal and the discharge terminal.

According to the present invention, in a battery apparatus which includes the above charge/discharge control circuit, and in which a charging path and a discharging path are separated from each other, monitoring the state of the load is capable at a release from an abnormal state of the connected load which caused the discharge overcurrent detection in a discharge overcurrent detection state after being in an overcharge detection state. Since the control circuit turns on the charge control FET in response to a signal to instruct turning on of the charge control FET even when the control circuit turns off the charge control FET in response to the signal to instruct turning off of the charge control FET from the charge/discharge monitoring circuit, the load open detection circuit can be connected to the load through the charger detection terminal and the charge control FET which has been turned on, thereby making it possible to monitor the state of the load. Thus, release from the abnormal state of the connected load turns on the discharge control FET, permitting recovery from the discharge overcurrent detection state.

DETAILED DESCRIPTION OF THE EMBODIMENTS

Embodiments of the present invention will hereinafter be described with reference to the accompanying drawings.

Figure 1:
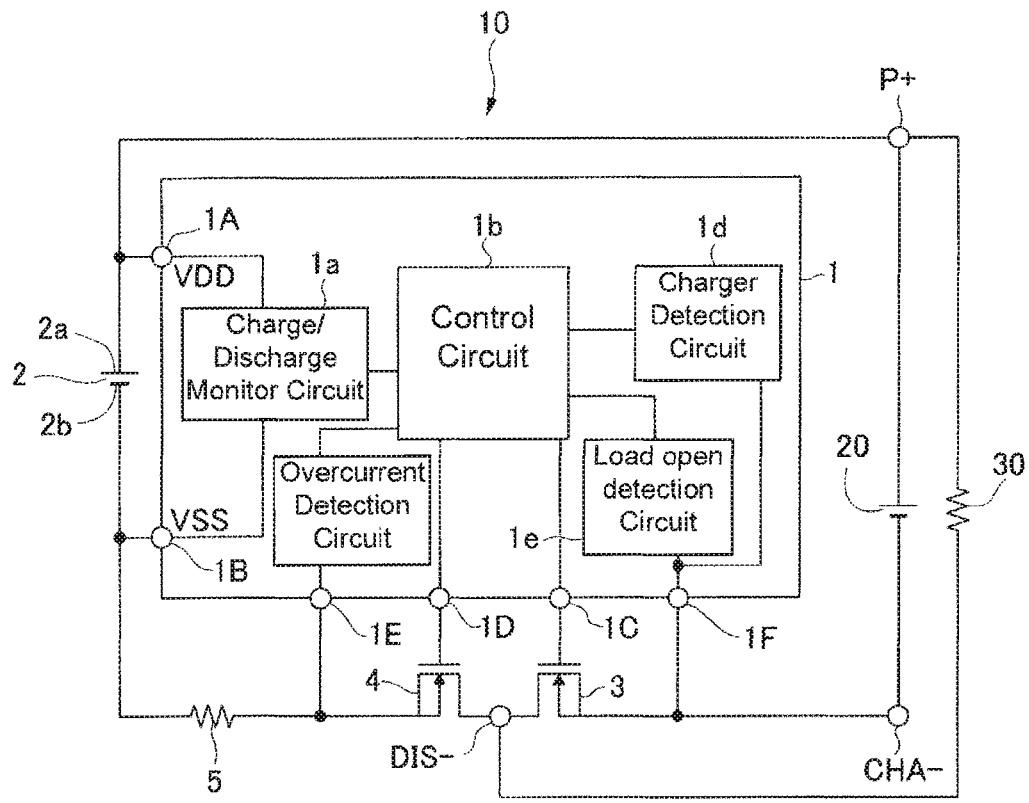
FIG. 1 is a diagram illustrating a battery apparatus equipped with a charge/discharge control circuit according to one embodiment of the present invention.

FIG. 1 is a diagram illustrating a battery apparatus 10 equipped with a charge/discharge control circuit 1 according to an embodiment of the present invention.

The battery apparatus 10 is equipped with the charge/discharge control circuit 1, a secondary battery 2, a charge/discharge terminal P+, a discharge terminal DIS−, a charge terminal CHA−, a charge control FET3, a discharge control FET4, and a resistor 5. The charge control FET3 controls charging to the secondary battery 2. The discharge control FET4 controls discharging from the secondary battery 2.

The charge/discharge terminal P+ is connected to a first electrode 2a of the secondary battery 2. One end of the resistor 5 is connected to a second electrode 2b of the secondary battery 2. A source terminal of the discharge control FET4 is connected to the other end of the resistor 5. A drain terminal of the charge control FET3 is connected to a drain terminal of the discharge control FET4. The charge terminal CHA− is connected to a source terminal of the charge control FET3. The discharge terminal DIS− is connected to a connecting point (drain terminals of both FETs) of the charge control FET3 and the discharge control FET4.

A charger 20 is connected between the charge/discharge terminal P+ and the charge terminal CHA−. A load 30 is connected between the charge/discharge terminal P+ and the discharge terminal DIS−.

The battery apparatus 10 has thus a configuration in which a charging path and a discharging path are separated from each other.

The charge/discharge control circuit 1 is equipped with a first power supply terminal 1A, a second power supply terminal 1B, a charge control terminal 1C, a discharge control terminal 1D, an overcurrent detection terminal 1E, and a charger detection terminal 1F. Further, the charge/discharge control circuit 1 is equipped with a charge/discharge monitoring circuit 1a, a control circuit 1b, an overcurrent detection circuit 1c, a charger detection circuit 1d, and a load open detection circuit 1e. The charge/discharge monitoring circuit 1a is connected to the first power supply terminal 1A and the second power supply terminal 1B and monitors a charge/discharge state of the secondary battery 2. The control circuit 1b controls the charge control FET3 and the discharge control FET4. The overcurrent detection circuit 1c detects a discharge overcurrent from the secondary battery 2 and a charge overcurrent to the secondary battery 2. The charger detection circuit 1d detects a connecting state of the charger 20.

The first power supply terminal 1A is connected to the first electrode 2a of the secondary battery 2 and thereby supplies a first power supply voltage VDD to each circuit in the charge/discharge control circuit 1. The second power supply terminal 1B is connected to the second electrode 2b of the secondary battery 2 and thereby supplies a second power supply voltage VSS to each circuit in the charge/discharge control circuit 1. The control circuit 1b is connected to the charge/discharge monitoring circuit 1a, the overcurrent detection circuit 1c, the charger detection circuit 1d, and the load open detection circuit 1e. Also, the control circuit 1b is connected to the charge control terminal 1C. The charge control terminal 1C is connected to a gate terminal of the charge control FET3. Further, the control circuit 1b is connected to the discharge control terminal 1D. The discharge control terminal 1D is connected to a gate terminal of the discharge control FET4. The overcurrent detection circuit 1c is connected to the overcurrent detection terminal 1E. The overcurrent detection terminal 1E is connected to the other end of the resistor 5. The charger detection circuit 1d and the load open detection circuit 1e are connected to the charger detection terminal 1F. The charger detection terminal 1F is connected to the source terminal of the charge control FET3.

The charger detection terminal 1F is also used as a terminal for monitoring the state of the load connected to the battery apparatus 10.

The battery apparatus 10 having such a configuration operates as follows.

First, the charger 20 is connected between the charge/discharge terminal P+ and the charge terminal CHA−, and then the charger 20 performs charging to the secondary battery 2. The charging to the secondary battery 2 continues, and the voltage of the secondary battery 2 becomes a voltage equal to or higher than an overcharge voltage, then the charge/discharge monitoring circuit 1a outputs a signal to instruct the turning off of the charge control FET3 to the control circuit 1b. In response to the signal, the control circuit 1b turns off the charge control FET3 and thereby enters an overcharge detection state.

In such an overcharge detection state, the load 30 is connected between the charge/discharge terminal P+ and the discharge terminal DIS−, and the load 30 goes into an abnormal state to make a large current flow, then a potential difference developed across the resistor 5 becomes large, exceeding a voltage determined to be a discharge overcurrent. The overcurrent detection circuit 1c detects the discharge overcurrent and outputs a signal to instruct turning off of the discharge control FET4 to the control circuit 1b. In response to the signal, the control circuit 1b turns off the discharge control FET4.

The battery apparatus 10 is thus brought into a state in which both charging and discharging are prohibited.

Thereafter, the charger 20 is disconnected, and the charger detection circuit 1d detects based on the voltage of the charger detection terminal 1F connected to the charge terminal CHA—that the charger 20 is not connected, and outputs a signal to instruct turning on of the charge control FET3 to the control circuit 1b. As is illustrated at 402 in FIG. 4, although, at this time, the control circuit 1b turns off the charge control FET3 based on the instruction issued from the charge/discharge monitoring circuit 1a as described above, the control circuit 1b turns on the charge control FET3 while giving priority to the signal instructing the turning on of the charge control FET3 from the charger detection circuit 1d.

Figure 4:
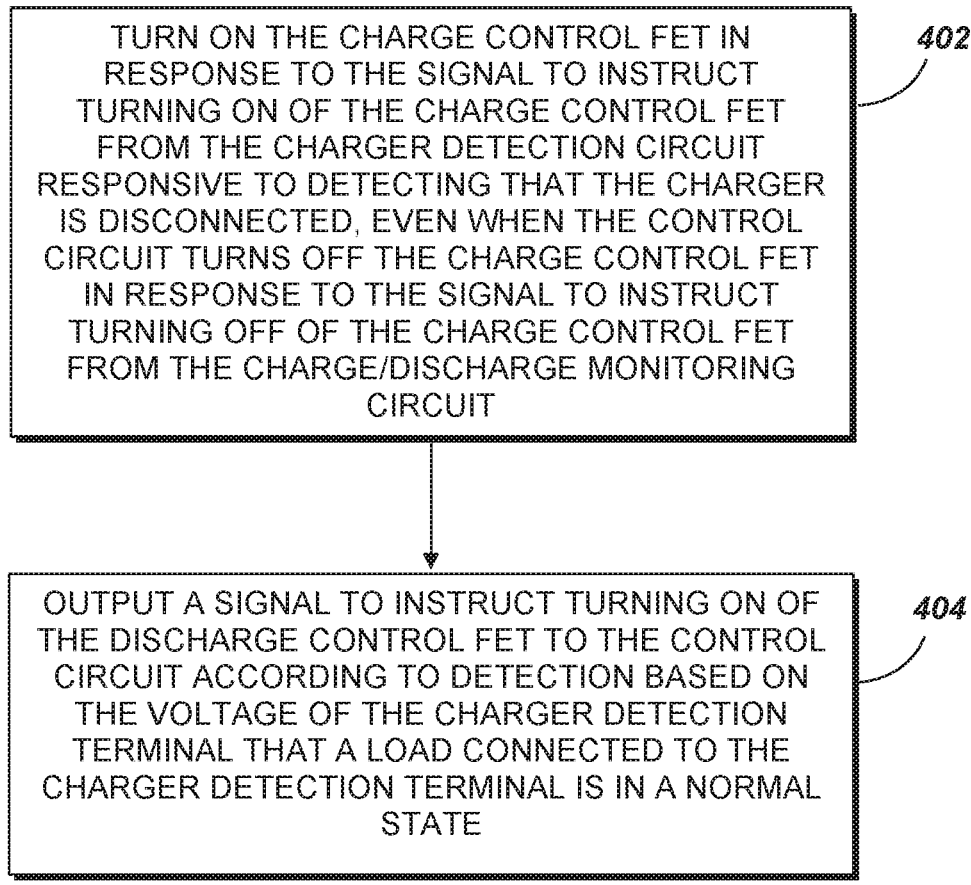
FIG. 4 is a flow diagram illustrating example functions performed by the charge/discharge control circuit illustrated in FIG. 1.

Since the voltage of the secondary battery 2 does not arise higher once the charger 20 is disconnected even if the secondary battery 2 is in the overcharged state, no problem occurs at turning on of the charge control FET3 by the control circuit 1b, as is illustrated at 402 in FIG. 4.

The charge control FET3 turns on in the above-described manner, the charger detection terminal 1F is then brought into a state of being connected to the load 30 through the charge control FET3. Thus, the load open detection circuit 1e becomes capable of detecting the state of the load 30, based on the voltage of the charger detection terminal 1F. Then, as is illustrated at 404 in FIG. 4, the abnormal state of the load 30 is released, i.e., the load 30 returns to its normal state or the load 30 is disconnected, the load open detection circuit 1e detects that the load 30 is in the normal state or disconnected, and outputs a signal to instruct turning on of the discharge control FET4 to the control circuit 1b. The control circuit 1b turns on the discharge control FET4 based on the signal.

Thus, the battery apparatus 10 returns to a state in which both of the charging and the discharging are permitted.

According to the present embodiment as described above, in response to release from the abnormal state of the load 30 connected to the battery apparatus 10 in a discharge overcurrent detection state in which the discharge control FET is turned off by a large current flow caused by an abnormal state of the load 30 after being in the overcharge detection state in which the charge control FET3 is off, the charge control FET3 turns on based on the disconnection of the charger 20, and hence the load open detection circuit 1e is capable of detecting that the abnormal state of the connected load 30 has been released. Thus, once the disconnection of the charger 20 is detected, the battery apparatus 10 can recover from the discharge overcurrent state without waiting for the falling of the voltage of the secondary battery 2 below the overcharge voltage to turn on the charge control FET3.

Figure 2:
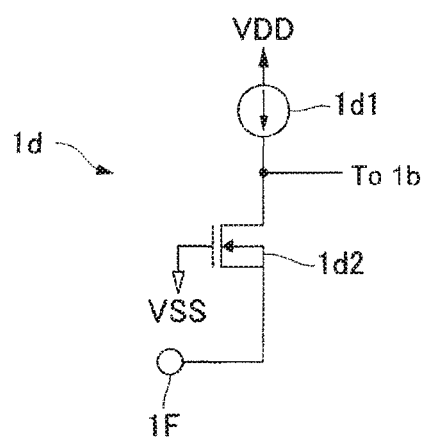
FIG. 2 is a circuit diagram illustrating an example of a charger detection circuit illustrated in FIG. 1.

FIG. 2 is a circuit diagram illustrating one example of the charger detection circuit 1d illustrated in FIG. 1.

The charger detection circuit 1d of the present example is equipped with a constant current source 1d1 and an NMOS transistor 1d2.

The constant current source 1d1 has one end which receives the first power supply voltage VDD corresponding to the voltage of the first power supply terminal 1A. The NMOS transistor 1d2 has a drain terminal connected to the other end of the constant current source 1d1, a gate terminal which receives the second power supply voltage VSS corresponding to the voltage of the second power supply terminal 1B, and a source terminal connected to the charger detection terminal 1F. Further, a connecting point of the constant current source 1d1 and the drain terminal of the NMOS transistor 1d2 serves as the output of the charger detection circuit 1d.

The charger detection circuit 1d having such a configuration determines whether the charger 20 is connected based on the voltage of the charger detection terminal 1F as described below.

Since the voltage of the charger 20 is larger than the voltage of the secondary battery 2, the voltage of the charger detection terminal 1F becomes lower than second power supply voltage VSS when the charger 20 is connected between the charge/discharge terminal P+ and the charge terminal CHA−. As a result, the NMOS transistor 1d2 turns on, and the charger detection circuit 1d outputs a signal of an L level indicating that the charger 20 is connected, to the control circuit 1b.

On the other hand, when the charger 20 is not connected between the charge/discharge terminal P+ and the charge terminal CHA−, the voltage of the charger detection terminal 1F becomes the second power supply voltage VSS which is the same voltage as the voltage of the gate terminal of the NMOS transistor 1d2. Then, the NMOS transistor 1d2 turns off. Thus, the charger detection circuit 1d outputs a signal of an H level indicating that the charger 20 is being disconnected, to the control circuit 1b.

Figure 3:
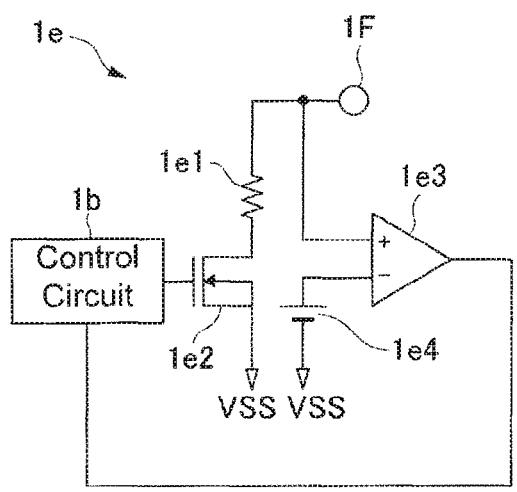
FIG. 3 is a circuit diagram illustrating an example of a load open detection circuit illustrated in FIG. 1.

FIG. 3 is a circuit diagram illustrating one example of the load open detection circuit 1e illustrated in FIG. 1.

The load open detection circuit 1e of the present example is equipped with a resistor 1e1, an NMOS transistor 1e2, a comparator 1e3, and a reference voltage source 1e4.

One end of the resistor 1e1 and a non-inversion input terminal of the comparator 1e3 are connected to the charger detection terminal 1F. The NMOS transistor 1e2 has a drain terminal connected to the other end of the resistor 1e1, a gate terminal which receives the output of the control circuit 1b, and a source terminal which receives the second power supply voltage VSS. The voltage of the reference voltage source 1e4 is supplied to an inversion input terminal of the comparator 1e3. Further, the output of the comparator 1e3 is the output of the load open detection circuit 1e. The voltage of the reference voltage source 1e4 is set to a voltage value to be a criterion for determining whether the status of the load 30 connected to the charger detection terminal 1F is abnormal.

The load open detection circuit 1e having such a configuration determines whether the load 30 is in the abnormal state based on the voltage of the charger detection terminal 1F as described below.

In response to the off-state of the discharge control FET4, the control circuit 1b supplies a signal of an H level to the gate terminal of the NMOS transistor 1e2. Thus, the NMOS transistor 1e2 turns on. Since the discharge control FET4 is off, the charger detection terminal 1F becomes a state of being connected to the charge/discharge terminal P+ through the charge control FET3 and the load 30. Accordingly, the voltage of the charger detection terminal 1F becomes a voltage obtained by dividing a difference between the voltage of the charge/discharge terminal P+ and the second power supply voltage VSS by a resistance ratio between the load 30 and the resistor 1e1.

At this time, when the load 30 is in the abnormal state, the voltage of the charger detection terminal 1F rises and becomes almost the voltage of the charge/discharge terminal P+. Thus, the comparator 1e3 outputs a signal of an H level indicating that the load 30 is abnormal, to the control circuit 1b. The control circuit 1b maintains an off state of the discharge control FET4 based on the signal.

On the other hand, when the load 30 is in a normal state or disconnected, the voltage of the charger detection terminal 1F becomes the second power supply voltage VSS and hence falls below the voltage of the reference voltage source 1e4 since the NMOS transistor 1e2 is on. Thus, the comparator 1e3 outputs a signal of an L level indicating that the load 30 is in the normal state or not connected, to the control circuit 1b. Based on the signal, the control circuit 1b turns on the discharge control FET4 which has been turned off.

Further, in response to the on-state of the discharge control FET4 the control circuit 1b supplies a signal of an L level to the gate terminal of the NMOS transistor 1e2. Thus, the NMOS transistor 1e2 turns off. Since the discharge control FET4 is on, the charger detection terminal 1F becomes a state of being connected to the second electrode 2b of the secondary battery 2 through the charge control FET3, the discharge control FET4, and the resistor 5. Accordingly, the voltage of the charger detection terminal 1F becomes the second power supply voltage VSS. Thus, the comparator 1e3 outputs a signal of an L level indicating that the load 30 is normal, to the control circuit 1b. Therefore, the control circuit 1b maintains an on state of the discharge control FET4.

Although the embodiments of the present invention and their modifications have been described above, these embodiments and their modifications have been presented as examples and are not intended to limit the scope of the invention. These embodiments and their modifications can be implemented in various other forms, and various omissions, substitutions and modifications can be made within the scope not departing from the spirit of the invention. These embodiments and their modifications are included in the scope and spirit of the invention and also included in the invention described in the scope of the appended claims and within the scope of equivalency thereof. Further, the above-described embodiments and their modifications can be appropriately combined with each other.

For example, since the charge/discharge control circuit of the present invention exhibits a desired effect in the battery apparatus in which the charging path and the discharging path are separated, the above embodiment has illustrated only the example in which the charge/discharge control circuit of the present invention is used in the battery apparatus 10 in which the charging path and the discharging path are separated. However, the charge/discharge control circuit of the present invention can also be used in a battery apparatus in which a charging path and a discharging path are in common. That is, the charge/discharge control circuit of the present invention can be applied to both of the battery apparatus in which the charging path and the discharging path are separated, and the battery apparatus in which the charging path and the discharging path are in common, and provide high versatility.

Further, although FIG. 2 has illustrated the example in which the charger detection circuit 1d is configured by the constant current source 1d1 and the NMOS transistor 1d2, the charger detection circuit 1d may be configured instead by use of a comparator.

What is claimed is:

1. A charge/discharge control circuit, comprising:
   a first power supply terminal connected to a first electrode of a secondary battery;
   a second power supply terminal connected to a second electrode of the secondary battery;
   a charge control terminal connected to a gate terminal of a charge control FET which controls charging to the secondary battery;
   a discharge control terminal connected to a gate terminal of a discharge control FET which controls discharging from the secondary battery;
   an overcurrent detection terminal connected to a source terminal of the discharge control FET;
   a charger detection terminal connected to a charger;
   a control circuit configured to output a control signal to the charge control terminal and the discharge control terminal respectively;
   a charge/discharge monitoring circuit connected to the first power supply terminal and the second power supply terminal, configured to monitor charge/discharge of the secondary battery, and configured to output a signal to instruct turning off of the charge control FET or the discharge control FET to the control circuit in response to detection of overcharge or overdischarge of the secondary battery;
   an overcurrent detection circuit connected to the overcurrent detection terminal and configured to output a signal to instruct turning off of the discharge control FET to the control circuit according to detection of a discharge overcurrent, based on a voltage of the overcurrent detection terminal;
   a charger detection circuit connected to the charger detection terminal and configured to output a signal to instruct turning on of the charge control FET to the control circuit in response to detecting, by the charger detection circuit, that the charger is disconnected based on a voltage of the charger detection terminal; and
   a load open detection circuit connected to the charger detection terminal and configured to output a signal to instruct turning on of the discharge control FET to the control circuit according to detection based on the voltage of the charger detection terminal that a load connected to the charger detection terminal is in a normal state,
   wherein the control circuit is configured to turn on the charge control FET in response to the signal to instruct turning on of the charge control FET from the charger detection circuit responsive to detecting that the charger is disconnected, even when the control circuit turns off the charge control FET in response to the signal to instruct turning off of the charge control FET from the charge/discharge monitoring circuit, and wherein the charger detection terminal is connected to the load through the charge control FET, and the load open detection circuit is connected to the load through the charger detection terminal and the charge control FET.

2. A battery apparatus comprising:
the charge/discharge control circuit according to claim 1;
the secondary battery having the first electrode and the second electrode;
a charge/discharge terminal connected to the first electrode of the secondary battery;
a resistor having one end connected to the second electrode of the secondary battery;
the discharge control FET having the source terminal connected to another end of the resistor;
the charge control FET having a drain terminal connected to a drain terminal of the discharge control FET;
a charge terminal connected to a source terminal of the charge control FET; and
a discharge terminal connected to a connecting point of the charge control FET and the discharge control FET.

* * * * *